(12) United States Patent
Kuhwald et al.

(10) Patent No.: US 9,048,804 B2
(45) Date of Patent: Jun. 2, 2015

(54) DEVICE AND A METHOD FOR FIXING A GAIN OR ATTENUATION FACTOR

(75) Inventors: Thomas Kuhwald, Markt Schwaben (DE); Thomas Valten, Unterhaching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/008,920

(22) PCT Filed: Mar. 13, 2012

(86) PCT No.: PCT/EP2012/054389
§ 371 (c)(1),
(2), (4) Date: Dec. 12, 2013

(87) PCT Pub. No.: WO2012/130610
PCT Pub. Date: Oct. 4, 2012

(65) Prior Publication Data
US 2014/0093010 A1    Apr. 3, 2014

(30) Foreign Application Priority Data

Mar. 31, 2011    (DE) .......................... 10 2011 006 571
Aug. 19, 2011   (DE) .......................... 10 2011 081 245

(51) Int. Cl.
    *H04L 27/00*    (2006.01)
    *H03G 3/30*     (2006.01)

(52) U.S. Cl.
    CPC ........... *H03G 3/3089* (2013.01); *H03G 3/3073* (2013.01)

(58) Field of Classification Search
    CPC .............. H03G 3/3052; H03G 3/3068; H04L 27/3809; H04L 27/2647; H04L 1/0003

USPC ........................................... 375/295, 316, 345
See application file for complete search history.

(56) References Cited

U.S. PATENT DOCUMENTS

| 5,251,216 | A  |   | 10/1993 | Marshall et al. |
| 7,151,759 | B1 | * | 12/2006 | Ryan et al. ..................... 370/332 |
| 7,212,198 | B2 | * | 5/2007  | Muraki et ..................... 345/419 |
| 7,212,798 | B1 |   | 5/2007  | Adams et al. |
| 7,471,748 | B2 | * | 12/2008 | Habuka et al. ................ 375/345 |
| 7,853,224 | B2 |   | 12/2010 | Exeter |

(Continued)

FOREIGN PATENT DOCUMENTS

| DE | 102 55 606 A1 | 6/2004 |
| DE | 602 21 526 T2 | 5/2008 |
| EP | 0 455 388 A2  | 11/1991 |

OTHER PUBLICATIONS

International Preliminary Report on Patentability for Corresponding International Application No. PCT/EP2012/054389 dated Oct. 10, 2013, 13 pages.

*Primary Examiner* — Ted Wang
(74) *Attorney, Agent, or Firm* — Ditthavong & Steiner, P.C.

(57) ABSTRACT

A device for fixing a gain or attenuation factor for a gain or attenuation element during a transmission of a sequence of synchronization-data symbols registers the signal level of a received signal at the input of the gain or attenuation element. It then identifies the start of transmission of the sequence of synchronization-data symbols on the basis of the signal level of the registered, received signal and signals the time interval for the fixing of the gain or attenuation factor starting with the identified start of transmission of the sequence of synchronization-data symbols.

15 Claims, 7 Drawing Sheets

(56) References Cited

U.S. PATENT DOCUMENTS

2001/0028275 A1 10/2001 Matsugatani et al.
2008/0291975 A1 11/2008 Sorgel et al.
2009/0310690 A1 12/2009 Lee

* cited by examiner

DEVICE AND A METHOD FOR FIXING A GAIN OR ATTENUATION FACTOR

CROSS-REFERENCE TO RELATED APPLICATION

The present application is a national phase application of PCT Application No. PCT/EP2012/054389, filed on Mar. 13, 2012, and claims priority to German Application No. 10 2011 006 571.7, filed on Mar. 31, 2011, and German Application No. 10 2011 081 245.8, filed on Aug. 19, 2011, the entire contents of which are herein incorporated by reference.

BACKGROUND OF THE INVENTION

1. Field of the Invention

The invention relates to a device and a method for fixing a gain or attenuation factor for a gain or attenuation element.

2. Discussion of the Background

To achieve a time synchronization between transmitting and receiving radio devices, a special sequence of synchronization-data symbols, a so-called synchronization hop, as illustrated in FIG. 1, is preferably transmitted. In the receiving radio device, the received synchronization-data symbols are correlated with the reference synchronization-data symbols known to the receiving radio device in order to determine a time reference of the synchronization-data symbols received. The time of the correlation maximum represents a reference time. The synchronization-data symbols are preferably transmitted using a frequency-hop method with a linear modulation method. This leads to a variation of the envelope curve of the sequence of synchronization-data symbols, as indicated by the grey hatched area in FIG. 1.

The signal level of the received signal of the radio device also varies as a result of the variation of the envelope curve, the amplitude distortion in the transmission channel and superposed amplitude noise. A change in the signal level of the received signal leads to the activation of an automatic gain control (Automatic Gain Control (AGC)) of the individual gain elements or respectively attenuation elements, which are adjustable with regard to their gain factor or attenuation factor in the input signal pathway of the radio device. An AGC control is described, for example, in U.S. Pat. No. 7,853,224 B2. The change of the envelope-curve level of the received signal once again disadvantageously leads to an incorrect detection of the received signal.

SUMMARY OF THE INVENTION

Embodiment of the invention develop further an automatic adjustment of a gain or attenuation factor for a gain or attenuation element in such a manner that an error-free detection of a sequence of synchronization-data symbols is guaranteed.

Embodiments of a method according to the invention and embodiments of the device according to the invention each register the signal level of the received signal with a first detector at the input of the respective gain or attenuation element and, in a first unit, identify the start of transmission of the sequence of synchronization-data symbols on the basis of the signal level characteristic registered. As soon as the start of transmission of the sequence of synchronization-data symbols has been identified, the gain or attenuation factor of the respective gain or attenuation element is fixed on the gain or attenuation factor set at the time of the start of transmission of the sequence of synchronization-data symbols. For this purpose, a signal is supplied from a second unit to the respective gain or attenuation element, which signals the time interval of the fixing of the gain or attenuation factor. As a result of the fixing of the gain or attenuation factor, no change of the signal level of the synchronization-data symbols at the input of the detector, which determines the synchronization-data symbols from the received signal, occurs during the transmission duration of the sequence of synchronization-data symbols, and, accordingly, in an advantageous manner, an erroneous detection of synchronization-data symbols does not occur.

The fixing of the gain or attenuation factor in the respective gain or attenuation element preferably ends at the latest with the completion of the transmission of the sequence of synchronization-data symbols.

If the signal level of the individual received synchronization-data symbols drops below an applicable threshold value before the end of the transmission of the sequence of synchronization-data symbols, an invalid signal level of the received signal, which no longer matches the input dynamic range of a downstream signal-processing unit cannot be anticipated, and a fixing of the gain or attenuation factor is therefore no longer necessary and can preferably be cancelled. For this purpose, the signal level of the received signal registered by the first detector at the input of the respective gain or attenuation element is averaged over a given averaging interval in order to avoid an error cancellation of the fixing of the gain or attenuation factor on the basis of a short-term drop in signal level. The averaged signal-level values are then compared in a first comparator with a first threshold value, below which an invalid signal level of the received signal cannot be anticipated, in order to identify a prematurely ended fixing.

If the averaged signal level values fall below this first threshold value, the first comparator signals a premature cancellation of the fixing of the gain or attenuation factor to the second unit, which signals the time interval of the fixing of the gain or attenuation factor to the gain or attenuation element. Instead of signal-level values, power-level values can also be used and are also covered by the invention.

From the start of the fixing of the gain or attenuation factor, the signal level of the received signal is preferably checked at individual positions in the input-signal path of the radio device with regard to an overshooting of a second threshold value, at which an unacceptable overdriving of one or more signal-processing units, for example, an amplifier or an analog-digital converter occurs in the input-signal path of the radio device. In the event of an overshooting of this second threshold value by the signal level of the received signal, the fixing of the gain or attenuation factor of the respective gain or attenuation element is switched off for a given first time duration, in order to reduce the signal level of the received signal at the output of the respective gain or attenuation element within this first time duration to a value below the second threshold level, with a modified gain or attenuation factor of the respective gain or attenuation element.

For this purpose, such an invalid signal level of the received signal is preferably identified in a third unit, and a temporary suspension of the fixing of the gain or attenuation factor is signalled to the second unit.

Accordingly, in a first embodiment of the temporary suspension of the fixing of the gain or attenuation factor, the signal level of the signal disposed at the input of the respective gain or attenuation element registered by the first detector at the time of the start of transmission of the sequence of synchronization-data symbols is preferably stored in a first storage unit associated with the third unit, and added to the threshold value in a downstream adder also associated with the third unit. A signal level of the signal disposed at the input of the respective gain or attenuation element, registered by the first detector and stored currently at each time in a second storage unit, also associated with the third unit, is compared in a second comparator, also associated with the third unit, with regard to an overshooting of the signal level, increased by the second threshold value, of the received signal disposed at the input of the respective gain or attenuation element from the first detector, at the time of the start of transmission of the sequence of synchronization-data symbols.

If an overshoot is identified by the second comparator, an invalid signal level of the received signal is present, which leads to an undesired overdriving of a signal-processing unit. This invalid signal level is preferably signalled by the third unit to the second unit, which once again signals to the gain or attenuation element the temporary cancellation of the fixing of the gain or attenuation factor.

In a second embodiment of the temporary suspension of the fixing of the gain or attenuation factor, the signal level of the received signal disposed at the input of the respective gain or attenuation element registered by the first detector is weighted in a multiplier associated with the third unit with the gain or attenuation factor of the respective gain or attenuation element, and the accordingly weighted signal level of the received signal is checked in a second comparator associated with the third unit with regard to an overshooting of the second threshold value. If an overshoot is identified by the second comparator, a critical signal level of the received signal is also present, which is signalled by the third unit to the second unit for the temporary suspension of the fixing of the gain or attenuation factor.

In a third embodiment of the temporary suspension of the fixing of the gain or attenuation factor, a signal level of the received signal disposed at the output of the respective gain or attenuation element registered by a second detector is compared in a second comparator associated with the third unit with a second threshold value. If an overshoot of the second threshold value by the registered signal level of the received signal at the output of the gain or attenuation element is identified by the second comparator, a critical signal level of the received signal is also present, which is signalled by the third unit to the second unit for the temporary suspension of the fixing of the gain or attenuation factor.

The checking of the signal level of the received signal with regard to an identification of an invalid signal level of the received signal, which begins at the start of transmission of the sequence of synchronization-data symbols and therefore at the beginning of the fixing of the gain or attenuation factor of the respective gain or attenuation element, is preferably implemented only over a given second time duration, which is reduced by comparison with the overall transmission time of the sequence of synchronization-data symbols. A critical signal level of the received signal occurring at the end of the transmission time of the sequence of synchronization-data symbols is therefore ignored, because, in this case, even with a fast AGC control, the time required for the correct adjustment of the gain or attenuation factor is no longer available.

In order to identify the start of transmission of the sequence of synchronization data and therefore the start of the fixing of the gain or attenuation factor, differences of respectively successive signal-level values of the received signal registered by the first detector at the input of the respective gain or attenuation element are preferably determined in a difference former associated with the first unit. With this difference formation, the rising edge of a sequence of synchronization-data symbols can be identified.

In a preferably subsequent matched filtering in a matched filter associated with the first unit, interference-signal components contained in the received signal, for example, superposed noise or subsidiary channel crosstalk, is attenuated or respectively removed.

In a subsequent, third comparator also associated with the first unit, the filtered signal-level differences of the received signal are preferably compared with regard to an overshooting of a third threshold value. Since the characteristic of the filtered signal-level differences of the received signal typically provides the characteristic of a smoothed rectangular pulse, the comparison with the third threshold value leads to a time interval between the two times of the overshooting and the undershooting of the third threshold value, at which the rate of increase of the rising edge of the sequence of synchronization-data symbols is disposed above a minimum rate of increase.

By comparing the time interval in which the rising edge of the sequence of synchronization-data symbols provides a rate of increase disposed above the minimum rate of increase with a fourth or respectively fifth threshold value, in a fourth or respectively fifth comparator, also associated with the first unit, it is preferably possible to check whether this determined time interval is disposed within a tolerance range specified by the fourth or respectively fifth threshold value. If this is the case, a signal edge of a sequence of synchronization-data symbols is unambiguously present, and therefore also the time of the start of transmission of a sequence of synchronization-data symbols, which is signalled by the first unit to the second unit.

BRIEF DESCRIPTION OF THE DRAWINGS

The device according to the invention and the method according to the invention for fixing a gain or attenuation factor of a gain or attenuation element are explained in detail below with reference to the drawings. The drawings show.

DETAILED DESCRIPTION OF EXEMPLARY EMBODIMENTS OF THE INVENTION

In the following section, the method according to the invention for fixing a gain or attenuation factor of a gain or attenuation element are explained with reference to a flow chart in FIG. 14, and the corresponding device according to the invention for fixing a gain or attenuation factor of a gain or attenuation element is explained in detail with reference to the block-circuit diagrams in FIGS. 11, 12A, 12B and 12C and the state diagram in FIG. 13.

Figure 11:
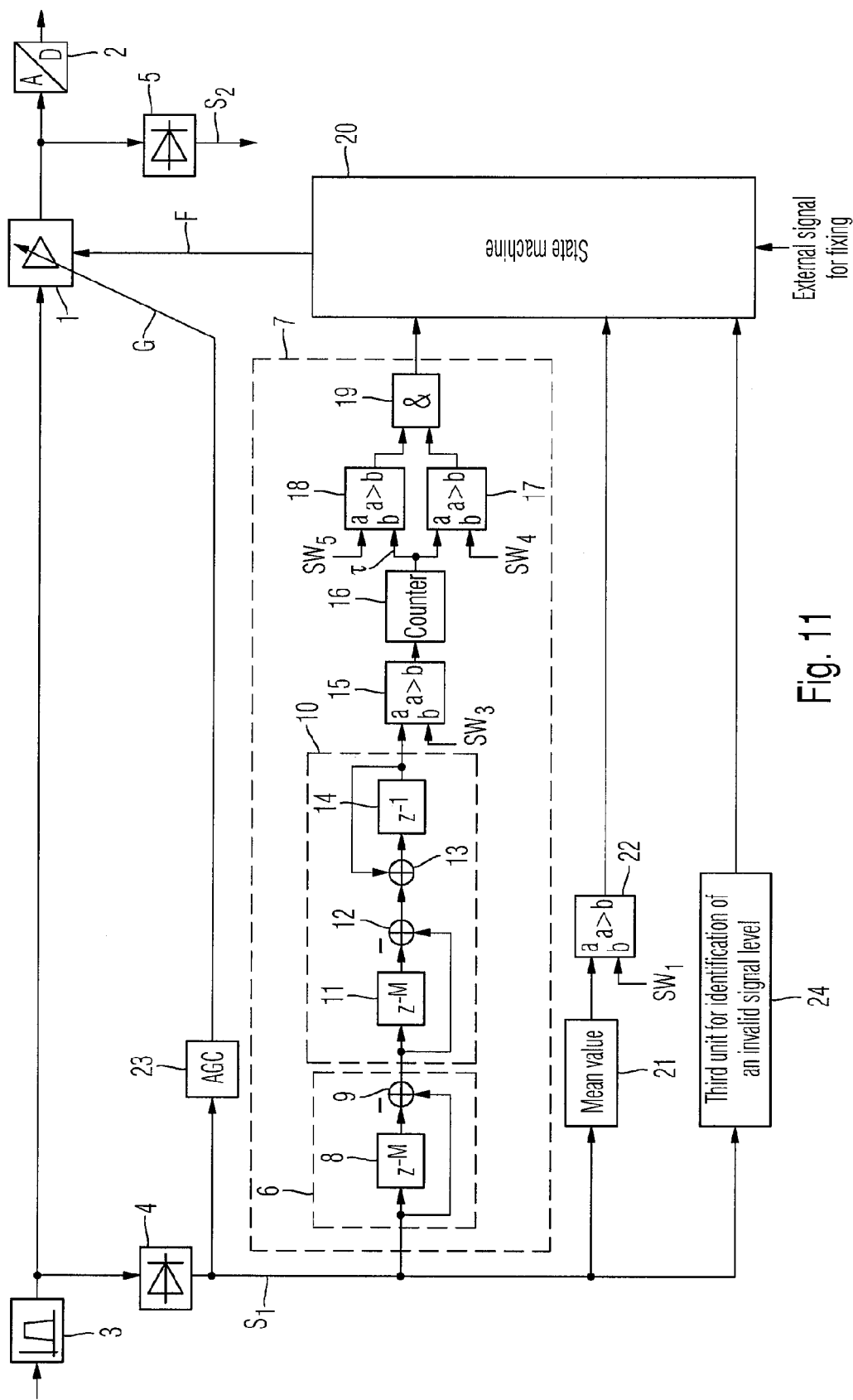
FIG. 11 a block-circuit diagram of a device according to the invention for fixing a gain or attenuation factor of a gain or attenuation element.

As illustrated in FIG. 11, a gain element 1 adjustable with regard to its gain factor G is connected at its output to a signal processing unit—in FIG. 11, for example, an analog-digital converter 2—of which the input dynamic is limited and is therefore relevant for the adjustment of the gain factor G of the gain element 1. At the input end, the gain element 1 is connected to a further signal-processing unit—in FIG. 11, for example, a selective filter 3 embodied as a band-pass filter—of which the output dynamic is not relevant for the adjustment of the gain factor G of the gain element 1. Instead of a gain element 1 adjustable with regard to its gain factor G, an attenuation element adjustable with regard to its attenuation factor ATT can also be used.

Figure 14:
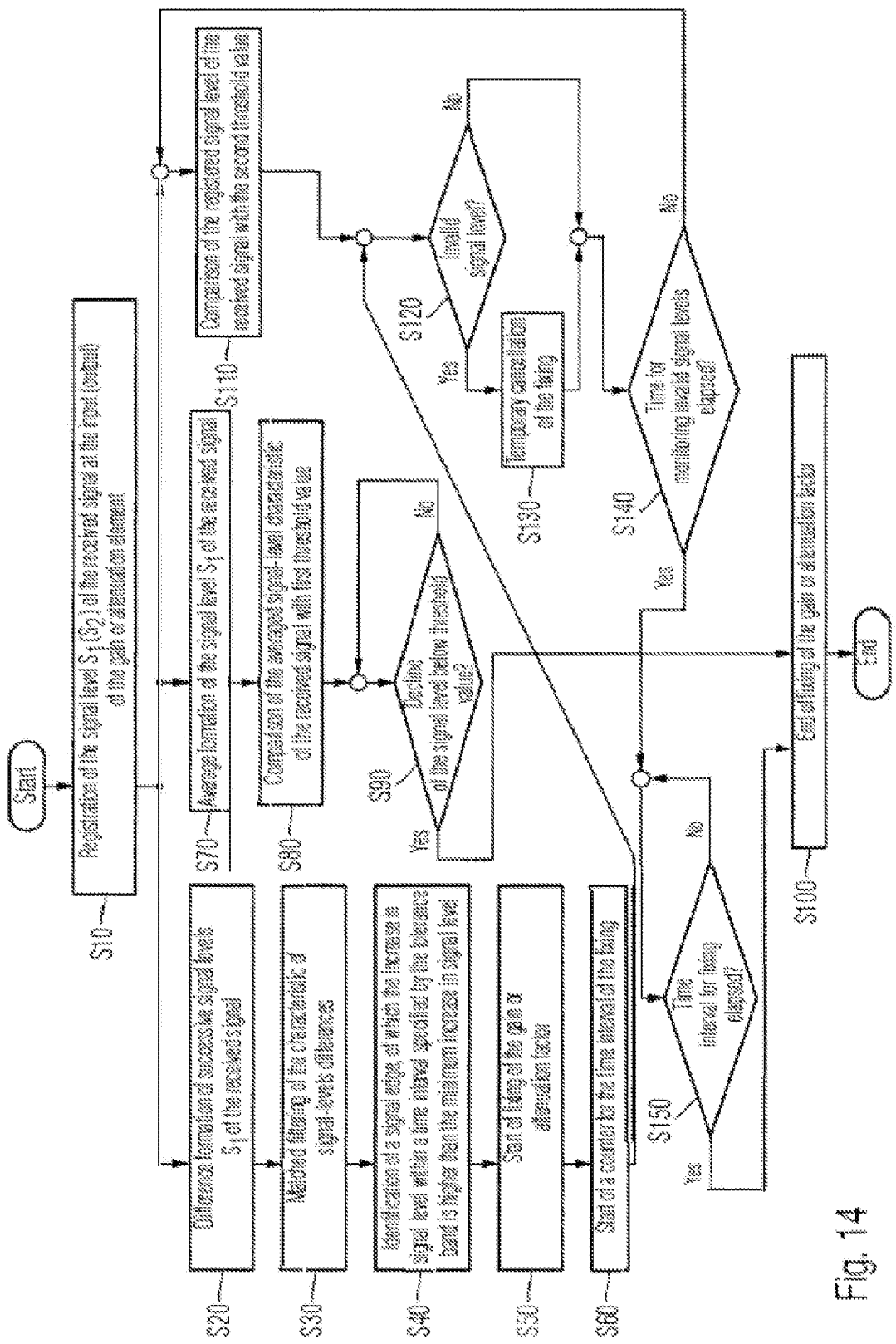
FIG. 14 a flow chart of the method according to the invention for fixing a gain or attenuation factor of a gain or attenuation element.

In the first method step S10 in FIG. 14, the signal level $S_1$ of the received signal at the input of the gain element 1 is registered in a first detector 4, and the signal level $S_2$ of the received signal at the output of the gain element 2 is registered in a second detector 5. Instead of the signal level of the received signal, the power level of the received signal can also be measured as an alternative in a detector appropriate for this purpose. The following description is based upon a measurement of the signal level of the received signal, whereas the description also applies for the measurement of a power level of the received signal. On the basis of the registered signal level $S_1$ ($S_2$) of the received signal, the gain factor G to be adjusted in each case for the gain element 1 (or respectively the attenuation factor ATT to be adjusted in each case for the attenuation element) is determined in a unit 23 for automatic gain control (Automatic Gain Control (AGC)).

In the next method step S20, differences of respectively successive signal levels $S_1$ of the received signal measured by the first detector 4 at the input of the gain element 1 are determined in a difference former 6, which is associated with a first unit 7, in which the start of transmission of a sequence of synchronization-data symbols is determined. For this purpose, the signal level of the received signal measured at the input of the gain element 1 is delayed by means of an M-value delay unit 8 by a total of M sampling cycles, and then, subtracted in a subtractor 9 from the non-delayed signal level of the received signal. The signal at the output of the difference former 6 represents a measure for the gradient of a signal edge contained in the measured received signal.

In the next method step S30, the signal at the output of the difference former 6, which is formed from the differences of respectively successive signal levels $S_1$ of the received signal measured by the first detector 4 at the input of the gain element 1, is supplied for a matched filtering in a matched filter 10 associated with the first unit 7. The matched filter 10 comprises a differentiation element with an M-value delay unit 11 and with a subtractor 12 and a downstream accumulator with an adder 13 and with a delay unit 14. Interference-signal components superposed in the signal-level differences of the received signal are attenuated or removed by the matched filtering. These are primarily superposed noise signal components or superposed crosstalk signal components of adjacent channels of the received channel set in the radio device. While the differentiation element of the matched filter 10 models the matched filter criterion (delay by M sampling cycles), the accumulator of the matched filter 10, which provides a low-pass characteristic, implements an additional attenuation or removal of high-frequency interference-signal components.

Figure 2:
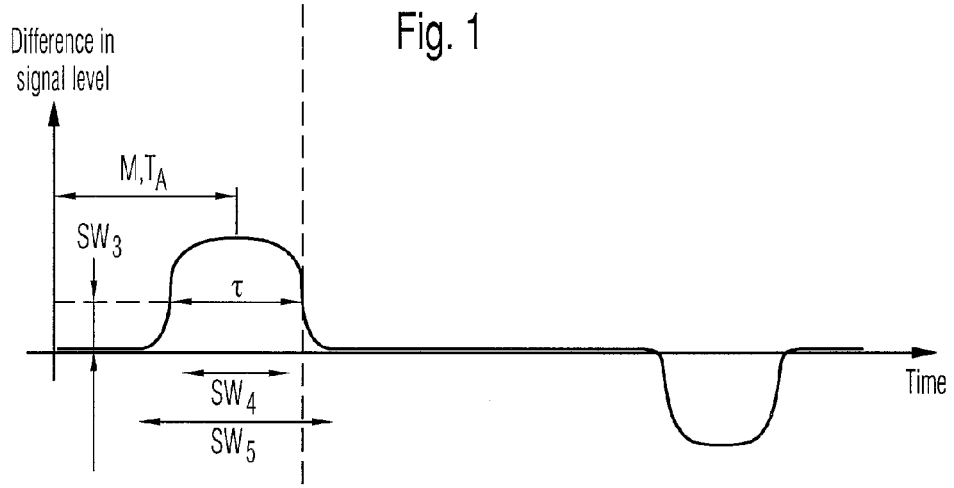
FIG. 2 a time-flow diagram of a characteristic of signal-level differences of the associated sequence of synchronization-data symbols.

In the next method step S40, the start of transmission of a sequence of synchronization-data symbols is finally identified. For this purpose, the characteristic of the matched filtered signal-level difference is compared in a downstream third comparator 15 with a third threshold value $SW_3$ as shown in FIG. 2 in order to determine a signal-level portion of the received signal measured by the first detector 4 at the input of the gain element 1 with a signal edge, of which the gradient is disposed above a minimum increase in signal level. The minimum increase in signal level is determined by parametrizing the third threshold value $SW_3$. The binary signal at the output of the third comparator 15 is activated within the signal portion of the received signal in which a signal edge with a gradient higher than the set minimum increase in signal level occurs.

The time duration τ of this signal portion of the received signal is determined in a downstream counter 16 by counting the sampling cycles which occur during an activated output signal of the third comparator 15. As shown in FIG. 2, the time duration τ of the signal portion of the received signal with a signal edge of which the gradient is disposed above a minimum increase in signal level is compared in a downstream fourth comparator 17 with a fourth threshold value $SW_4$, which represents a lower threshold value of a tolerance range for the time duration τ of the signal portion of the received signal under investigation. In parallel, the time duration τ of the received signal with a signal edge of which the gradient is disposed above a minimum increase in signal level, is compared in a downstream fifth comparator 18 with a fifth threshold value $SW_5$, as shown in FIG. 2, which represents an upper threshold value of a tolerance range for the time duration τ of the signal portion of the received signal under investigation.

Through logical AND-linking of the binary output signal of the fourth and fifth comparator 17 and 18 in an AND-gate 19, it is determined whether the time duration τ of the signal portion of the received signal with a signal edge of which the gradient is disposed above a minimum increase in signal level, is disposed within the tolerance range specified by the fixed and fifth threshold value $SW_4$ and $SW_5$. If this is the case, a rising signal edge of a sequence of synchronization-data symbols is present.

Figure 1:
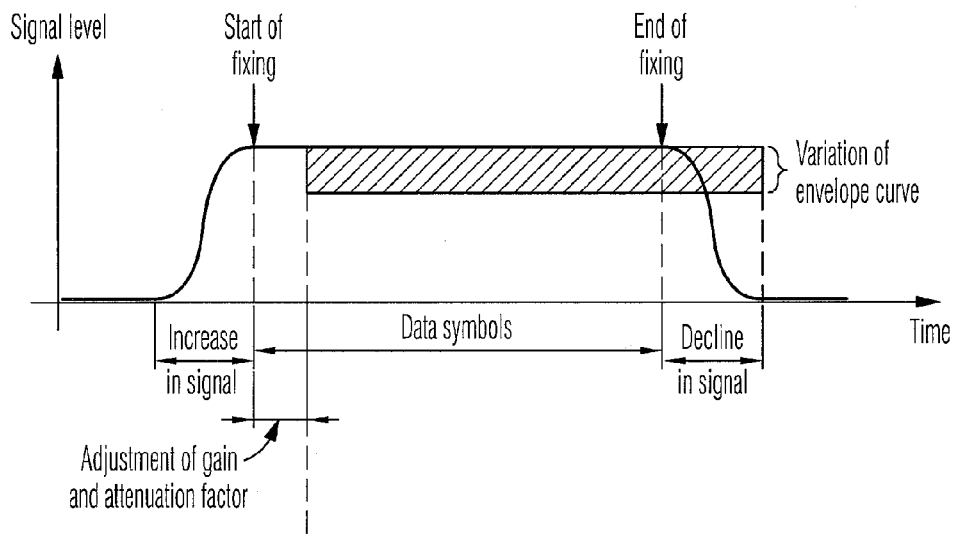
FIG. 1 a time-flow diagram of a sequence of synchronization-data symbols.

Through the time delay resulting from the M-value delay in the difference former 6 and in the matched filter 10 and resulting from the accumulation in the matched filter 10 and the counting in the counter 16, the time of activation of the binary output signal and of the AND-gate 19 is delayed by comparison with the time of occurrence of the signal edge of the sequence of synchronization-data symbols. In this context, the time delay is parametrized in such a manner that the activation of the binary output signal of the AND-gate 19 coincides precisely with the start of transmission of the synchronization-data symbols, which is delayed, as shown in FIG. 1, from the rising signal edge of the sequence of synchronization-data symbols by the adjustment interval for the gain or attenuation factor.

Figure 3:
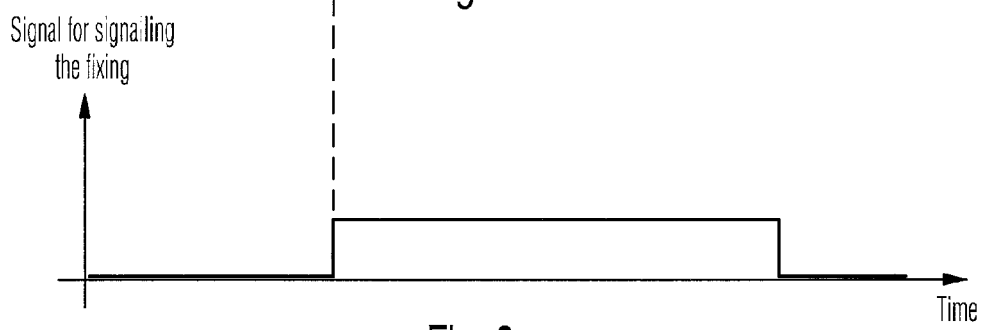
FIG. 3 a time-flow diagram of an associated signal for fixing the gain or attenuation factor.

The output signal of the AND-gate 19 is supplied to a second unit 20, which is realized in the exemplary embodiment as a state machine and signals the time interval for the fixing of the gain factor G of the gain element 1 (or respectively of the attenuation factor ATT of an attenuation element) to the gain element 1 (or respectively to the attenuation element) via the signal F. In the next method step S50, with the activation of the output signal of the AND-gate 19, which marks the start of transmission of the synchronization-data symbols, the fixing of the gain factor G of the gain element 1 (or respectively of the attenuation factor ATT of an attenuation element) to the gain element 1 (or respectively to the attenuation element) is started via the activated signal F according to FIG. 3.

In the next method step S60, with the start of the fixing of the gain factor G of the gain element 1 (or respectively of the attenuation factor ATT of an attenuation element), a time element integrated in the second unit 20, which displays the course of the time duration $\tau_{Fix}$ of the time interval of the fixing, is started.

In parallel with the identification of the start of transmission of the sequence of synchronization-data symbols according to method steps S10 to S40, in method step S70, the mean value of a sequence of signal levels of the received signal measured by the first detector 4 at the input of the gain element 1 is determined in an average former 21 via an appropriate parametrized averaging interval.

In the subsequent method step S80, the averaged signal-level sequence of the received signal is compared in a downstream first comparator 22 with a first threshold value $SW_1$.

Figure 4:
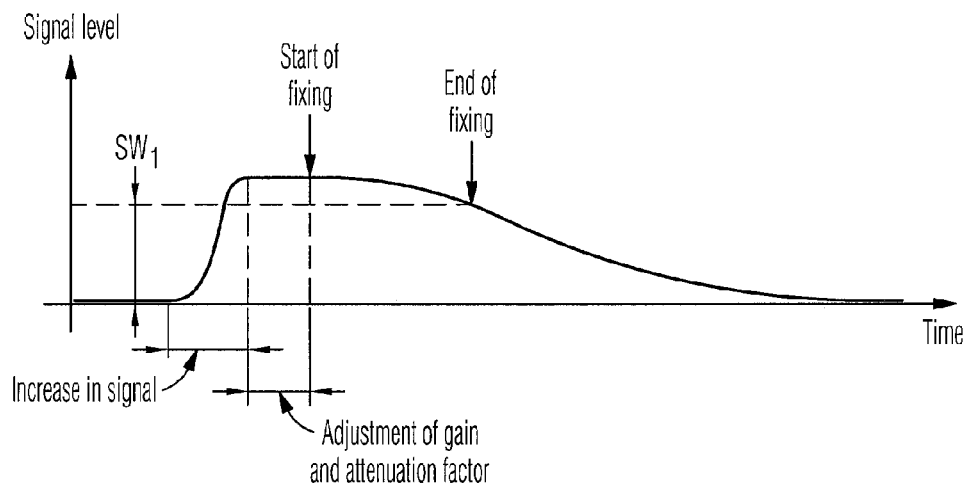
FIG. 4 a time-flow diagram of a sequence of synchronization-data symbols with declining signal level.

In the next method step S90, as shown in FIG. 4, if an undershoot of the first threshold value $SW_1$ by the averaged signal-level sequence of the received signal is identified, a continued fixing of the gain factor G of the gain element 1 (or respectively of the attenuation factor ATT of an attenuation element) is no longer relevant. Averaging the signal-level sequence of the received signal avoids a premature end of the fixing of the gain factor G of the gain element 1 (or respectively of the attenuation factor ATT of an attenuation element) through a short-term drop in the signal level of the received signal.

The undershooting of the first threshold value $SW_1$ by the averaged signal-level sequence of the received signal is signalled by the first comparator 22 to the second unit 20, which in turn, according to method step S100, signals to the gain element 1 (or respectively to the attenuation element) the end of the fixing of the gain factor G of the gain element (or respectively of the attenuation factor ATT of an attenuation element) by deactivating the fixing signal F.

Figure 5:
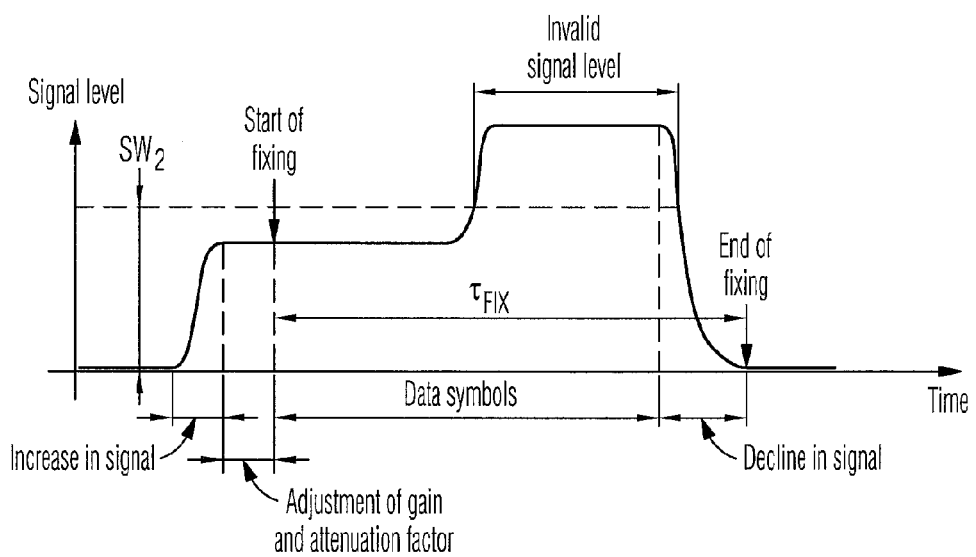
FIG. 5 a time-flow diagram with a sequence of synchronization-data symbols with invalid signal level values.

Similarly, in parallel with the identification of the start of transmission of the sequence of synchronization-data symbols according to the method steps S10 to S40 and in parallel with the identification of a fixing of the gain factor G or of the attenuation factor ATT for the gain element 1 or respectively for the attenuation element to be ended prematurely according to method steps S70 to S90, an invalid signal level of the received signal is investigated, in a method step S110, in a third unit 24, which is marked as shown in FIG. 5, by an overshooting of a second threshold value $SW_2$.

Figure 12A:
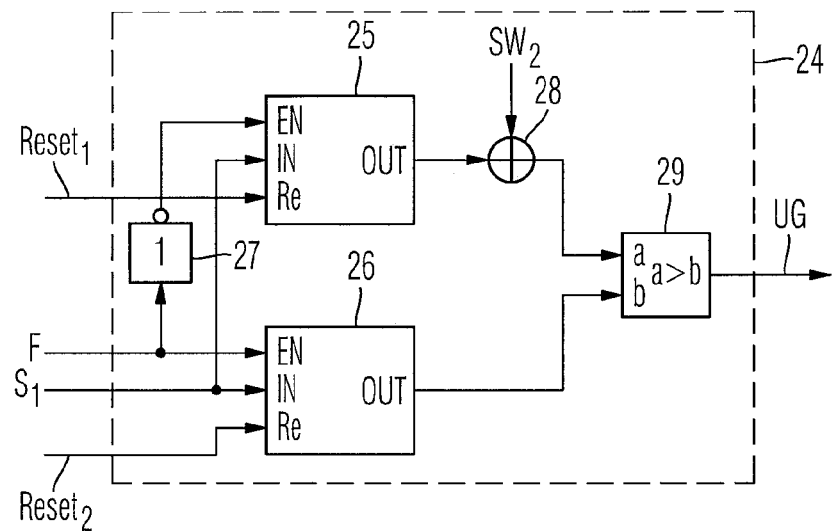
FIGS. 12A, 12B, 12C a block-circuit diagram of a first, second and third embodiment of a third unit for identifying and signalling an invalid signal level.

In a first embodiment of a third unit 24, which identifies an invalid signal level of the received signal, according to FIG. 12A, a first storage unit 25 and a second storage unit 26 are provided. The received signal registered by the first detector 4 at the input of the gain element 1 is supplied for storage to the first storage unit 25 and also to the second storage unit 26. While the first storage unit 25 is supplied with the signal F inverted in the inverter 27 for the fixing of the gain factor or attenuation factor of the gain element or attenuation element, the second storage unit 26 is supplied with the non-inverted signal F for the fixing of the gain or attenuation factor of the gain or attenuation element.

Through an activated signal F for the fixing of the gain or attenuation factor of the gain or attenuation element, the output OUT of the second storage unit 26 is updated with the signal level of the received signal disposed at the input IN of the second storage unit 26, while, through an inverted, activated signal F for the fixing of the gain or attenuation factor of the gain or attenuation element, the signal level of the received signal disposed at the input IN of the first storage unit 25 at the time of the transition from the non-activated state to the activated state of the signal F for the fixing of the gain or attenuation factor of the gain or attenuation element is transferred to the output OUT of the first storage unit 25 and held until a change of the signal F for the fixing of the gain or attenuation factor of the gain or attenuation element from the activated state to the non-activated state.

Figure 7:
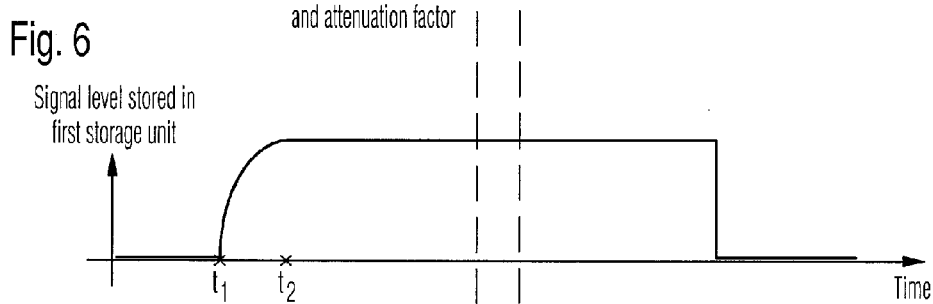
FIG. 7 a time-flow diagram of a signal level stored in the first storage unit.

With the deactivation of the reset inputs $Reset_1$ of the first storage unit 25 in the event of an overshooting of the third threshold value $SW_3$ by the signal level of the input signal registered by the first detector 4 at the input of the gain element 1—timing point $t_1$ in FIG. 7—the output OUT of the first storage unit 25 can be defined with a new value. From this timing point $t_1$, the release input EN of the first storage unit 25 is activated on the basis of the not yet activated signal F for the fixing of the gain or attenuation factor of the gain or attenuation element, and accordingly, the output OUT of the first storage unit 25 according to FIG. 7 is constantly updated with the signal level values of the received signal at the input IN of the first storage unit 25. With the activation of the signal F for the fixing of the gain or attenuation factor of the gain or attenuation element from the timing point $t_2$, the first storage unit 25 holds, at its output OUT, the signal-level value of the received signal disposed at its input IN at the timing point $t_2$ according to FIG. 7, while the output OUT of the first storage unit 25 is constantly updated with the signal-level values of the received signal disposed at the input IN according to FIG. 8, from the timing point $t_2$, at which the associated reset input $Reset_2$ is deactivated, and accordingly, a definition of the output of the second storage unit 26 with values is cleared.

In an adder 28 downstream of the first storage unit 25, the second threshold value $SW_2$ is added to the signal level of the received signal stored at the output OUT of the first storage unit 25. In a second comparator 29 downstream of the adder 28 and the second storage unit 26, the signal level of the received signal increased by the second threshold value $SW_2$ and held at the output OUT of the first storage unit 25 at the time of the fixing of the gain or attenuation factor of the gain or attenuation element—that is, at the time of the start of transmission of the synchronization-data symbols, is compared with the constantly updated signal level of the received signal at the output OUT of the second storage unit 26 from the time of the fixing of the gain or attenuation factor of the gain or attenuation element.

Figure 8:
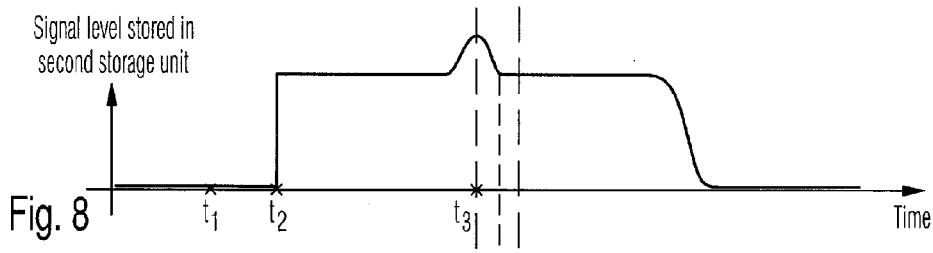
FIG. 8 a time-flow diagram of a signal level stored in the second storage unit.
Figure 9:
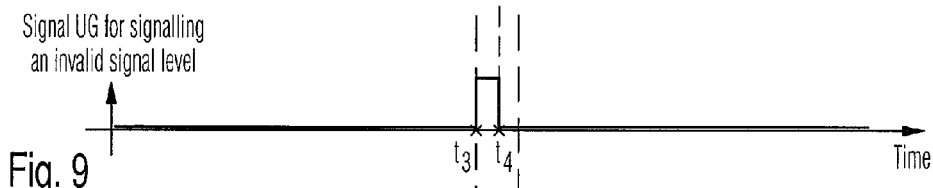
FIG. 9 a time-flow diagram of an associated signal for signalling an invalid signal level.

If the constantly updated signal level of the received signal at the output OUT of the second storage unit 26 overshoots the sum of the signal level of the received signal held at the output OUT of the first storage unit 25 and the second threshold value at the time $t_3$ according to FIG. 8, an invalid signal level of the received signal is present. This is signalled to the second unit 20 by the third unit 24 through a signal UG for signalling an invalid signal level according to FIG. 9. According to FIG. 9, this signal UG for signalling an invalid signal level is activated until the time $t_4$, at which the constantly updated signal level of the received signal at the output OUT of the second storage unit 26 falls below the summated value of the signal level of the received signal held at the output OUT of the first storage unit 26 and the second threshold value $SW_2$.

By means of the third unit 24 for the identification of an invalid signal level illustrated in FIG. 12A, an invalid signal level of the received signal is identified as soon as the signal level of the received signal overshoots a threshold value, which is specified by the signal level of the received signal during the fixing of the gain or attenuation factor of the gain or attenuation element with the addition of a second threshold value $SW_2$.

Figure 12B:
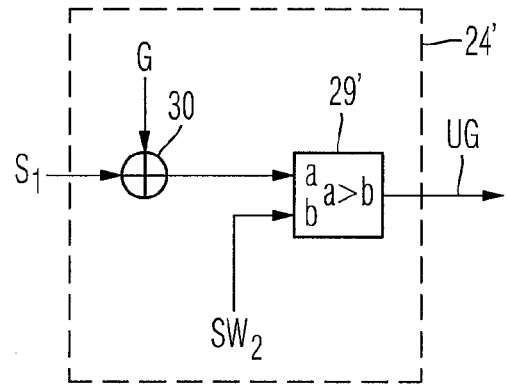

In a second embodiment of a third unit 24' for the identification of an invalid signal level according to FIG. 12B, the signal level $S_1$ of the received signal registered by the first detector 4 at the input of the gain element is multiplied in a multiplier 30 by the gain factor G (or respectively the attenuation factor ATT) set in the gain element 1 (or respectively the attenuation element) and the signal level $S_1$ weighted with the gain factor G (or respectively attenuation factor ATT) of the received signal registered by the first detector 4 at the input of the gain element 1 (or respectively attenuation element) is compared in a downstream second comparator 29' with a second threshold value $SW_2$. If the signal level of the received signal registered by the first detector 4 at the input of the gain element 1 (or respectively attenuation element) overshoots the second threshold value $SW_2$, an invalid signal level of the received signal is present, which is signalled to the second unit 20 with the signal UG for signalling an invalid signal level generated at the output of the second comparator 29'.

Figure 12C:
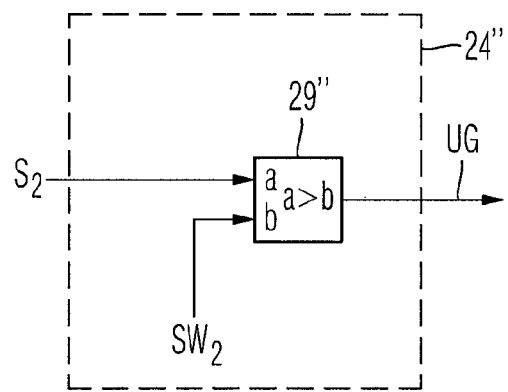

In a third embodiment of a third unit 24" for the identification of an invalid signal level as shown in FIG. 12C, the signal level $S_2$ of the received signal registered by the second detector 5 at the output of the gain element is compared in a second comparator 29" with a second threshold value $SW_2$. If the signal level of the received signal registered by the second detector 5 at the output of the gain element overshoots the second threshold value $SW_2$, an invalid signal level of the received signal is present, which is signalled to the second unit 20 the signal UG generated at the output of the second comparator 29" for signalling an invalid signal level.

Figure 6:
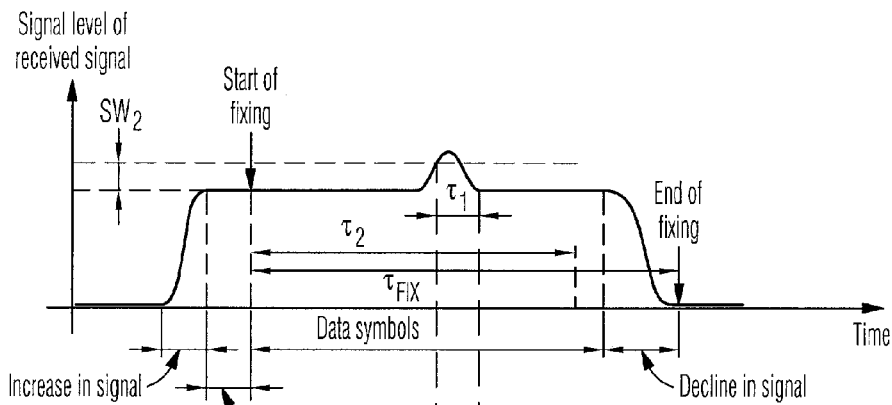
FIG. 6 a time-flow diagram of a sequence of synchronization-data symbols with invalid signal level values in the case of a temporary suspension of the fixing of the gain or attenuation factor.
Figure 10:
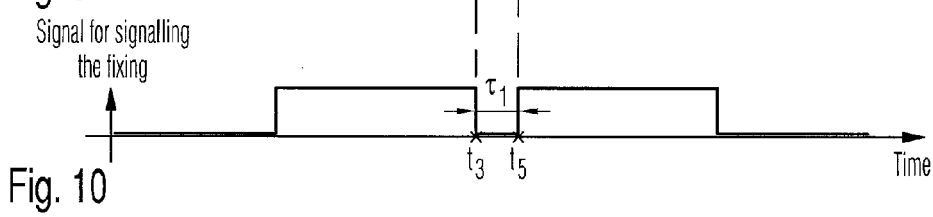
FIG. 10 a time-flow diagram of an associated signal for fixing the gain or attenuation factor.

In the next method step S120 in FIG. 14, if an invalid signal level of the received signal is identified through an activation of the signal UG for signalling an invalid signal level by the third unit 24, 24' or 24", the fixing of the gain or attenuation factor of the gain or attenuation element is temporarily cancelled, in the following method step S130, for a first time duration $\tau_1$ between the times $t_3$ and $t_5$ as shown in FIG. 6 and FIG. 10. Within this first time duration $\tau_1$, the automatic gain control 23 can adjust the gain factor G (or the attenuation factor ATT) of the gain element 1 (or respectively of the attenuation element). In this manner, the signal level of the received signal is reduced as shown in FIG. 6 to the value which it had during the fixing of the gain or attenuation factor of the gain or attenuation element. If the signal level of the received signal is again reduced to a value below the second threshold value $SW_2$, the signal UG for signalling an invalid signal level at the output of the third unit 24, 24', 24" for signalling an invalid signal level at the time $t_4$ is deactivated again according to FIG. 9.

The monitoring of the signal level of the received signal by means of the second threshold value $SW_2$ for the identification of an invalid signal level takes place only within a second time duration $\tau_2$, which is reduced by comparison with the time duration $\tau_{Fix}$ of the fixing of the gain or attenuation factor of the gain or attenuation element. If the course of the time duration $\tau_2$, which according to FIG. 6 is started at the start of the fixing of the gain or attenuation factor of the gain or attenuation element and accordingly at the start of transmission of the synchronization-data symbols, has been identified in the next method step S140 of FIG. 14, the course of the time interval $\tau_{Fix}$ for the fixing of the gain or attenuation factor of the gain or attenuation element is monitored in the subsequent method step S150. By contrast, if the time duration $\tau_2$ has not yet elapsed, the registered signal level of the received signal continues to be compared, according to method step S110, with the second threshold value $SW_2$ with regard to the identification of an invalid signal level.

After the expiry of the time interval $\tau_{Fix}$ for the fixing of the gain or attenuation factor of the gain or attenuation element, the fixing of the gain or attenuation factor of the gain or attenuation element is ended according to method step S100.

Figure 13:
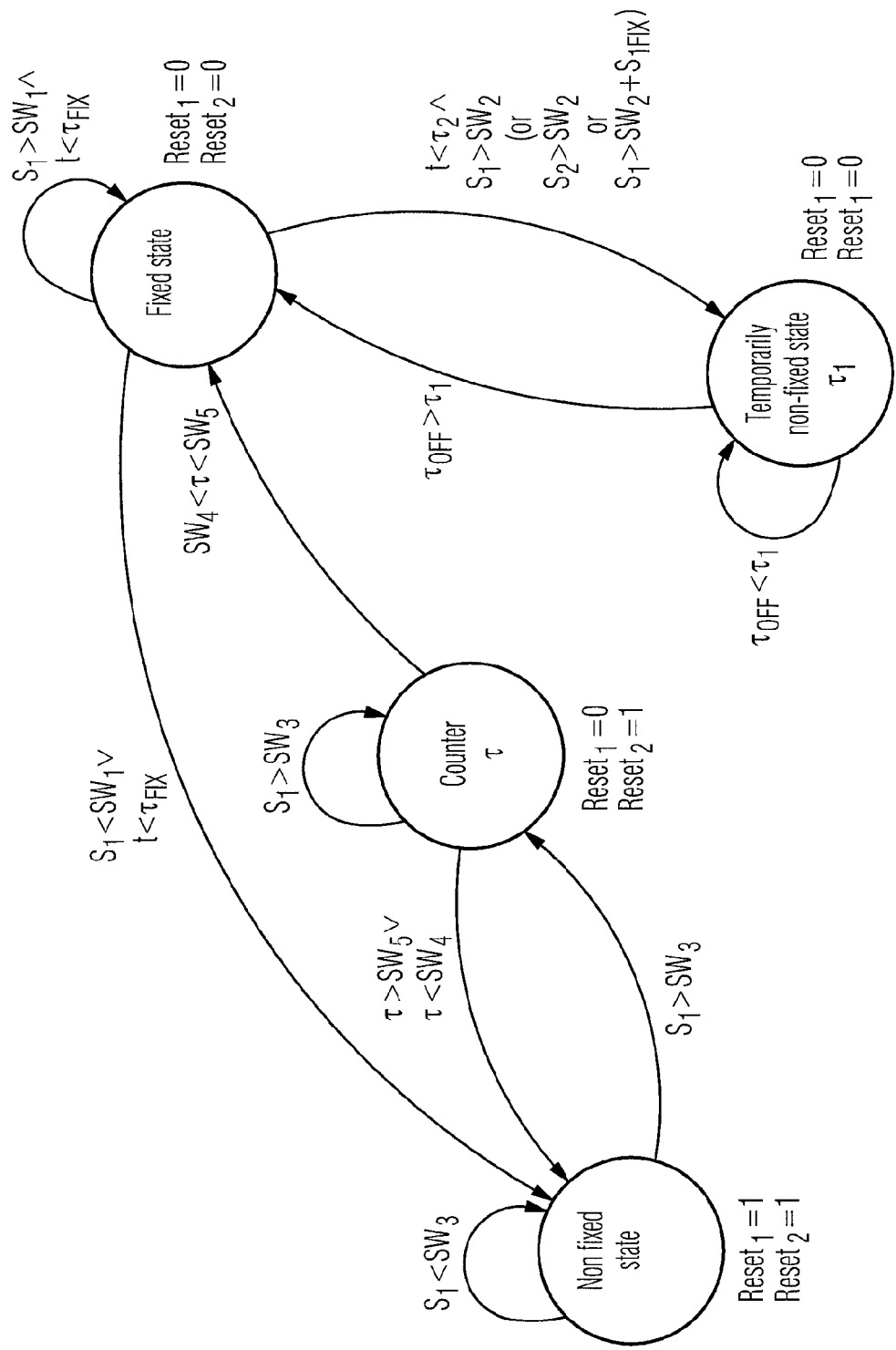
FIG. 13 a state diagram of the method according to the invention for fixing a gain or attenuation factor of a gain or attenuation element.

FIG. 13 shows the state diagram of the state machine of the second unit 20, which signals to the gain element 1 (or respectively to the attenuation element) the time interval of the fixing of the gain or attenuation factor of the gain or attenuation element. The following four states are shown:
non-fixed state,
state in which the counter 16 of the first unit 7 is active,
fixed state and
temporarily non-fixed state
alongside the conditions for a possible transition between the individual states and for remaining in the respective state.

The invention is not restricted to the exemplary embodiments of the method according to the invention and the device according to the invention presented. In particular, all possible combinations of the features illustrated in the drawings, the features described in the description and the features claimed in the claims are also covered by the invention.

The invention claimed is:

1. A method for fixing a gain or attenuation factor for a gain or attenuation element during a transmission of a sequence of synchronization-data symbols, comprising:
    registering a signal level of a received electronic signal at an input of the gain or attenuation element,
    identifying a start of transmission of the sequence of synchronization-data symbols on a basis of the registered signal level of the received electronic signal, and
    signalling of a time interval for the fixing of the gain or attenuation factor beginning with the identified start of transmission of the sequence of synchronization-data symbols,
    wherein the registered signal level of the received electronic signal is averaged over a given averaging interval and compared with a first threshold value in order to identify a prematurely ended fixing, and the time interval for the fixing of the gain or attenuation factor is prematurely ended, if the averaged signal level of the received electronic signal falls below the first threshold value; and
    wherein a signal-level difference of the received electronic signal registered at the input of the gain or attenuation element since a beginning of the time interval for the fixing of the gain or attenuation factor is compared with a second threshold value in order to identify an invalid signal level, and the fixing of the gain or attenuation factor is cancelled for a fixed first time duration, as soon as a determined signal level difference overshoots the second threshold value.

2. The method according to claim 1, wherein
    the time interval for the fixing of the gain or attenuation factor is ended at the latest after a transmission duration for the sequence of synchronization-data symbols.

3. The method according to claim 1, wherein,
from the beginning of the time interval for the fixing of the gain or attenuation factor, the signal level of the received signal multiplied by the fixed gain or attenuation factor and registered at the input of the gain or attenuation element is compared with the second threshold value in order to identify the invalid signal level, and the fixing of the gain or attenuation factor is cancelled for the fixed first time duration as soon as the signal level of the received signal multiplied by the fixed gain or attenuation factor overshoots the second threshold value.

4. The method according to claim 1, wherein,
from the start of the time interval for the fixing of the gain or attenuation factor, the signal level registered at an output of the gain or attenuation element is compared with the second threshold value in order to identify the invalid signal level, and the fixing of the gain or attenuation factor is cancelled for the fixed first time duration, as soon as the registered signal level of the received signal overshoots the second threshold value.

5. The method according to claim 1, wherein
the comparison of the registered signal level of the received signal with the second threshold value is limited to a second time duration, which is reduced by comparison with a transmission duration for the sequence of synchronization-data symbols.

6. The method according to claim 1, wherein identifying the start of transmission of the sequence of synchronization-data symbols contains the following steps:
difference formation of respectively successive signal levels of the received signal,
comparison of a characteristic of differences of successive signal levels of the received signal with a third threshold value in order to determine a time interval with an increase in signal level of the received signal greater than a minimum increase in signal level, and
identification of the start of transmission of the sequence of synchronization-data symbols, as soon as the time interval is disposed between fourth and fifth threshold values with an increase in signal level of the received signal greater than the minimum increase in signal level, which specifies a lower and respectively upper limit value for the time interval with an increase in signal level of the received signal greater than the minimum increase in signal level.

7. The method according to claim 6, wherein
a matched filtering of respectively formed differences is implemented after the difference formation.

8. A device for fixing a gain or attenuation factor for a gain or attenuation element during a transmission of a sequence of synchronization-data symbols, comprising:
a first detector for registering a signal level of a received signal at an input of the gain or attenuation element,
a first unit connected downstream of the first detector, which first unit determines a start of transmission of the sequence of synchronization-data symbols,
a second unit connected downstream of the first detector, which second unit signals to the gain or attenuation element a time interval for the fixing of the gain or attenuation factor, and
a third unit, which identifies an invalid signal level and signals a temporary cancellation of the fixing, is connected upstream of the second unit.

9. The device according to claim 8, wherein, additionally, an average former for determining an average value of the signal level of the received signal registered at the input of the gain or attenuation element and a first comparator, connected between the average former and the second unit are provided for identification and signalling of a prematurely ended fixing.

10. The device according to claim 9, wherein
the third unit is connected downstream of the first detector and provides a first storage unit for storing the signal level registered at a start of the transmission of the sequence of synchronization-data symbols by the first detector, a second storage unit for storing the signal level currently registered by the first detector, an adder for adding the signal level stored in the first storage unit and a threshold value, and a second comparator for signalling temporary cancellation of the fixing in case of an overshooting of the signal level stored in the first storage unit and of the threshold value by the signal level stored in the second storage unit.

11. The device according to claim 9, wherein
the third unit is connected downstream of the first detector and provides a multiplier for weighting of the signal level of the received signal registered by the first detector with the gain or attenuation factor of the gain or attenuation element and a second comparator connected downstream of the first detector for signalling temporary cancellation of the fixing in case of an overshooting of a threshold value by the weighted signal level of the received signal registered by the first detector.

12. The device according to claim 9, wherein
the third unit is connected downstream of a second detector for registering a signal level of a received signal at an output of the gain or attenuation element and provides a second comparator connected downstream of the second detector for signalling temporary cancellation of the fixing in case of an overshooting of a threshold value by the signal level of the received signal registered by the second detector.

13. The device according to claim 12, wherein
the first unit provides a difference former for forming differences of signal levels of the received signal, a third comparator for determining a time interval with an increase in the signal level of the received signal greater than a minimum increase in the signal level, a fourth or respectively fifth comparator for identifying and signalling a start of the transmission of the sequence of synchronization-data symbols in case of a time interval disposed between a further threshold value with the increase in the signal level of the received signal greater than the minimum increase in the signal level.

14. The device according to claim 13, wherein
a matched filter is connected between the difference former and the third comparator.

15. A non-transitory computer-software product with program-code means especially stored on a machine-readable carrier for implementation of all steps in claim 1 when a program is executed on a computer or a digital signal processor.

* * * * *